United States Patent [19]

Dudek et al.

[11] Patent Number: 5,296,259
[45] Date of Patent: Mar. 22, 1994

[54] PROCESS FOR MAKING ELECTRICALLY CONDUCTIVE PATTERNS

[75] Inventors: Dietmar Dudek, Oberursel, Fed. Rep. of Germany; Thomas Pfeiffer, Wilmington, Del.

[73] Assignee: E. I. du Pont de Nemours and Company, Wilmington, Del.

[21] Appl. No.: 969,542

[22] Filed: Oct. 30, 1992

Related U.S. Application Data

[63] Continuation of Ser. No. 510,334, Apr. 17, 1990, abandoned.

[30] Foreign Application Priority Data

Apr. 21, 1989 [DE] Fed. Rep. of Germany ....... 3913117

[51] Int. Cl.$^5$ .............................................. B05D 1/00
[52] U.S. Cl. .................................. 427/96; 427/126.1; 427/191; 427/192; 427/201; 427/380; 427/383.1; 427/384
[58] Field of Search ....................... 427/96, 126.1, 191, 427/192, 201, 380, 383.1, 384

[56] References Cited

U.S. PATENT DOCUMENTS

| | | | |
|---|---|---|---|
| 3,582,327 | 6/1971 | Boyd | 430/291 |
| 3,637,385 | 1/1972 | Hayes | 430/198 |
| 3,713,831 | 1/1973 | Hayes | 430/270 |
| 4,209,674 | 6/1980 | Kondo | 200/16 F |
| 4,273,842 | 6/1981 | Nonogaki | 430/176 |
| 4,303,698 | 12/1981 | Beske | 427/380 |
| 4,334,009 | 6/1982 | Charles | 427/201 |
| 4,346,162 | 8/1982 | Abele | 430/270 |
| 4,404,237 | 9/1983 | Eichelberger | 427/96 |
| 4,447,855 | 5/1984 | Lagrange et al. | 361/321 |
| 4,459,364 | 7/1984 | McSweeney et al. | 501/137 |
| 4,526,807 | 7/1985 | Auerbach | 427/96 |
| 4,540,676 | 9/1985 | Chu et al. | 501/138 |
| 4,604,340 | 8/1986 | Grossa | 430/270 |
| 4,640,905 | 2/1987 | Burn | 501/137 |
| 4,803,591 | 2/1989 | Miyashita et al. | 361/321 |
| 4,845,062 | 7/1989 | Burn | 501/136 |
| 4,940,605 | 7/1990 | Dampier | 427/126.1 |
| 5,110,384 | 5/1992 | Dudek | 427/96 |

FOREIGN PATENT DOCUMENTS

| | | | |
|---|---|---|---|
| 1155967 | 10/1983 | Canada . | |
| 182128 | 5/1986 | European Pat. Off. . | |
| 0205137 | 12/1986 | European Pat. Off. | 35/46 |
| 1210321 | 9/1960 | Fed. Rep. of Germany . | |
| 8808830 | 11/1988 | PCT Int'l Appl. | 35/46 |
| 2078387 | 1/1982 | United Kingdom . | |

OTHER PUBLICATIONS

Electrocomponent Science and Technology, 1976, vol. 2, pp. 241–247.

*Primary Examiner*—Shrive Beck
*Assistant Examiner*—Vi Duong Dang

[57] ABSTRACT

A process for making an electrically conductive pattern on a substrate comprising coating the substrate with a solution of salts containing at least one supplementary element, drying and heat treating the salt coating at a temperature lower than the temperature at which oxides form from the salts, then forming a metal conductive pattern on the heat treated supplementary element coating. This process can be used to make printed circuits on ceramic substrates which are useful in hybrid circuits, for example.

8 Claims, No Drawings

PROCESS FOR MAKING ELECTRICALLY CONDUCTIVE PATTERNS

This is a continuation of application Ser. No. 07/510,334 filed Apr. 17, 1990, now abandoned.

The subject of the invention is a process for making electrically conductive patterns on ceramic substrates like those used, for example, as electrical switching circuits in hybrid configurations.

German AS 11 07 743 and Canadian Patent 11 55 967 disclose the production of electrically conductive patterns on surfaces of ceramic substrates by the so-called powder process. In this process, a tacky pattern is produced on the substrate surface, and the surface is then treated with a metal powder. The tacky material can then be removed by thermal treatment, and the metal powder can be sintered to a continuous pattern of conductor lines.

Besides the actual conductive metal from which the conductor lines are formed, it is generally necessary to add supplementary elements, optionally in the form of suitable compounds, to make the patterned metal layer adhere to the substrate after sintering, and to control the sintering to produce conductor lines with a smooth surface and uniform cross-section. Adhesion is developed by two different mechanisms. In glass bonding, the oxides of the supplementary elements form a glass that melts at the firing temperature and after cooling, bonds the substrate with the conductor lines partly by adhesion and partly by surface interlock. In reactive or oxide bonding, an intermediate bonding phase is formed by the solid state reaction of these oxides with the substrate and the conductive metal. The selection of the supplementary elements is oriented correspondingly to the type of conductive metal and the type of substrate. Suitable combinations are known from thick film technology. For example, German Patent 25 43 922 cites compounds mediating adhesion of gold and silver on aluminum oxide, beryllium oxide and sapphire. These compounds contain cadmium, copper, lead, titanium, zirconium, silicon, boron and alkali metals. Compounds of rhodium, bismuth and silver are known to modify decorative gold coatings on ceramic substrates so that sintering results in uniform layers with good adhesion and a glossy surface (for example, see Ullmann's "Enzyklopaedie der technischen Chemie" ("Encyclopedia of Industrial Chemistry") 4th edition, Volume 14, page 10).

The activity of the supplementary elements is thought to occur principally at the interface between the substrate and the conductive metal, or at the surface of the conductive metal, respectively. It is generally disadvantageous whenever the supplementary metal penetrates the conductive metal and forms mixtures with it, because this reduces the specific conductivity of the conductor line.

German Patent Specification 38 06 515 describes a process by which metal powders for the powder process can be produced; these powders contain a homogeneous distribution of suitable compounds of the requisite supplementary elements. Fine conductor lines of good quality and conductivity can indeed be prepared by the use of these powders. However, the process for making the powders is relatively complex. A further disadvantage is that different powders must be made and stocked for different substrates and for the desired quality of the conductor lines.

European patent application 01 82 128 describes how to improve adhesion of thin metal films to a ceramic oxide by providing the latter with an intermediate layer of a metal oxide before the metal film is sputtered on. This oxide intermediate layer is made by high-temperature decomposition of a coating with a suitable metal compound. However, if a conductive pattern is made by the powder process on such an oxide interlayer, adhesion of this pattern to the ceramic oxide is unsatisfactory.

Therefore, the invention involves the problem of developing a process by which the supplementary elements required for controlling adhesion and the sintering phase in making electrically conductive patterns on ceramic substrates by the powder process are introduced into the system in a simple manner, so that they do not adversely affect conductivity of the conductive metal.

The invention is directed to a process for making an electrically conductive pattern on a substrate comprising:

(a) coating the substrate with a solution comprising a salt of a supplementary element or a mixture thereof, wherein the supplementary element(s) is/are selected from the group consisting of bismuth, cadmium, lead, copper, boron, rhodium, nickel, indium, aluminum, and silicon;

(b) drying the coated substrate;

(c) heating the dried substrate to a temperature lower than the temperature at which a supplementary element oxide forms;

(d) forming on the heat treated substrate a patterned adhesive layer that is at least temporarily tacky;

(e) applying a powder comprising metal to the patterned adhesive layer; and (f) firing the patterned substrate at a temperature and time sufficient to remove the adhesive layer and sinter the powder.

Basically, any type of salt is suitable for performing the process. The supplementary elements may be contained in the salt anion or cation. If the supplementary elements are metallic in nature, simple salts are preferred, especially acetates, nitrates or chlorides of these metals. On the other hand, salts containing a non-metallic supplementary element, for example, phosphorus or boron, in the form of a complex anion can also be used. Borates, especially alkali borates, are preferred salts of this type.

Treating the substrate as in the invention produces a surface layer that consists neither solely of the dried salt components of the solution used for coating, nor of supplementary element oxides generated from these salts on firing. It has been observed that on drying, a microcrystalline layer appears first, adhering poorly to the substrate and having a rough surface. If a light-sensitive coating is applied to such a layer, it becomes very uneven and moreover, there is also the risk that individual salt crystals may separate from the substrate, resulting in spot defects in the light-sensitive layer. Consequently, conductor line patterns made with such a layer by the powder process are also prone to defects. Moreover, as noted earlier, adhesion of the conductor lines to the substrate is unsatisfactory if, before the light-sensitive coating is applied, the substrate is heated so high that oxides of the supplementary elements are formed.

Why the process of the invention delivers better results than pre-coating the substrates with oxides, as in the current state of the art, or the somewhat similar production of a salt layer before coating of the light-sensitive layer, cannot be explained accurately. It is assumed that, in the thermal treatment, at least a portion of the salts applied is transformed by dissociation of chemically or physically bonded water, or by conversion to basic salts, into an intermediate state that, on one hand, adheres to the substrate better than the dried salts, but, on the other hand, reacts even further during the subsequent sintering of the powder image. As a result, the supplementary elements become so mobile that they can generate adhesion to the substrate and influence sintering in the desired manner. In certain instances, the occurrence of such intermediate states in thermal treatment of the salts can be detected by physical-chemical methods, for example, thermoanalysis. It is particularly advantageous if this intermediate state occurs in the form of a glass-like layer. This can be achieved by proper selection of the salts.

Selection of the supplementary elements is governed by the type of metal used to create the metallic pattern and by the type of substrate. For this, one skilled in the art can draw on the state of the art. The amount of supplementary element salts coated on the substrate depends on the amount of metal containing powder that will be coated over the supplementary elements, i.e. the weight per area of the conductor lines to be generated. In practice, the supplementary elements may be applied in amounts in the range of 0.1–25 weight percent of the conductor line weight per area, and preferably in the range of 1–10 weight percent.

Gold, silver, platinum, palladium or copper are especially preferred conductive metals for making the conductor line pattern. These metals are used as powders with an average particle size of 0.1 to 5 microns in pure form, in mixtures, or as powders of their alloys.

Preferred heat-resistant substrates are shaped structures of aluminum oxide of the current state of the art. However, other known substrates, for example, beryllium oxide, aluminum nitride, silicon dioxide or enameled metal can also be used.

Lead, rhodium, nickel, aluminum, cadmium, indium, copper, bismuth and/or boron are particularly suitable as supplementary elements for controlling adhesion and sintering. Thus, adhesion may be regulated both by the mechanism of oxide bonding and that of glass bonding.

To produce the pattern, which is at least temporarily tacky, on the substrate, a suitable adhesive is applied, for example, by screen printing on the substrate surface. However, for greater resolution and hence, significantly finer metallic patterns, it is preferable to use a light-sensitive layer with a tackiness that changes on exposure. Suitable compounds are described in the German Patents 12 10 321, 19 04 059, 19 44 311, 28 15 894, 30 23 247, 34 29 615 and others. The 1,4-dihydropyridine compounds of German Patent 34 29 615 are especially preferred as light-sensitive layer components.

The powders used are preferably pure powders of the metals or alloys selected for making the conductor line pattern. Naturally, mixtures of the corresponding metal powders may also be used instead of alloys. Similarly suitable are metal-containing powders that were made according to the teaching of Canadian Patent 11 55 967 or German Patent Specification 38 06 515 and partially or wholly containing the required supplementary elements.

The ceramic substrates with the powder patterns resulting from applying powders to the tacky surface areas are fired in the usual manner. In this step, the layers that are at least temporarily tacky are removed by vaporization or oxidation, and simultaneously, the powder patterns are sintered to the desired conductor line circuits.

Conductor line patterns made by the process of the invention have a very low foreign metal content, and hence, their specific conductivity approaches very closely that of pure compacted metals. Since they are easy to make in greater thicknesses than thin film patterns, their conductivity is superior to the latter. They have a glossy surface, very uniform line edges, and, even at widths below 20 microns, no breaks. Because they adhere very strongly and uniformly to the substrate, adhesion defect frequency is drastically reduced.

The supplementary elements needed to control sintering and adhesion can be completely contained in the substrate coating. Hence, pure metal powders that have not undergone any special pretreatment may be used for toning the tacky patterns. Because such powders are commercially available, the process is greatly simplified versus the state of the art. In this case, a further advantage is that the toner powder composition remains constant during use, because it has no components that might adhere selectively to the tacky surface.

The invention can be used for making metallic patterns on heat-resistant, particularly ceramic, substrates, as required, for example, for printed circuits, hybrid circuits, optical components, and for decorative purposes.

EXAMPLE

In a centrifugal coater unit operating at 1000 RPM, 5×5 cm plates of aluminum oxide were coated with one of the following solutions and heated by infrared radiation to about 200° C. for drying and heat treatment. Some of these plates were also annealed for 10 minutes at 900° C. and then cooled.

1. One part by weight bismuth (III) nitrate in nine parts by weight acetic acid.
2. One part by weight borax (sodium tetraborate decahydrate) in nine parts by weight water.

A solution of 3.25 grams of the dimethyl and 3.25 grams of the diethyl ester of 2,6-dimethyl-4-(2'-nitrophenyl)-1,4-dihydropyridine-3,5-dicarboxylic acid in 100 ml of methyl ethyl ketone was coated on these substrates and dried, so that the dry light-sensitive layer was about 1.5 microns thick. A mercury vapor lamp was used to expose on this layer a test pattern with conductor lines 25 microns wide and square areas of 2×2 mm for the bonding test. A powder pattern with a coating weight of about 5 mg/cm was produced on the exposed layer by the method of German Patent 37 36 391, using pure gold powder with an average particle size of about 1.5 microns. The plates were then fired for 10 minutes at 900° C. Microscopic study of the sample plates showed conductor lines with smooth edges.

Adhesion of the gold layer to the substrate was determined by bonding 37.5 micron thick gold wires on the 2×2 mm surface areas, and measuring the forces needed to separate them from the surface areas. This test was repeated about one hundred times. The number of tests wherein the separation force was less than 10 cN was determined. To measure the specific resistance of the conductor lines, their cross-section was calculated by weighing the amount of powder applied. Test results are shown in the table below.

COMPARISON TEST A

In this test, the substrate plates were not coated with solutions of salts of the supplementary elements. The tacky patterns were treated with a powder that had been made by the process described in Example 1 of German Patent 38 06 515 from 62.5 mg bismuth oxide, 31.3 mg cadmium oxide, 6.3 mg copper (I) oxide, 8.6 mg rhodium (III) oxide and 5 grams gold powder. Otherwise, the procedure was the same as in the above example.

COMPARISON TEST B

The procedure was the same as in Comparison Test A, except that the method described in Example 2 of German Patent Specification 38 06 515 was used to make the powder from 5 grams gold powder, a solution of 104 mg bismuth (III) acetate in 5 ml acetic acid, and a solution of 56.6 mg cadmium acetate, 16.2 mg copper (III) acetate and 19.0 mg rhodium (III) acetate in 5 ml water.

TABLE

| Sample | Heat Treatment (°C.) | Separation at 10 cN | Specific Resistance (uΩcm) |
|---|---|---|---|
| 1 | 200 | 0 | 2.8 |
| 1 | 900 | 44 | 2.8 |
| 2 | 200 | 0 | 2.8 |
| 2 | 900 | 100 | 2.8 |
| A | — | 27 | 4.8 |
| B | — | 0 | 3.5 |

We claim:

1. A process for making an electrically conductive pattern on a substrate comprising:
   (a) coating the substrate with a solution comprising a salt of a supplementary element or a mixture thereof, wherein the supplementary elements are selected from the group consisting of bismuth, cadmium, lead, copper, boron, rhodium, nickel, indium, aluminum, and silicon;
   (b) drying the coated substrate;
   (c) heating the dried substrate to a temperature lower than the temperature at which a supplementary element oxide forms;
   (d) forming on the heat treated substrate a patterned adhesive layer that is at least temporarily tacky;
   (e) applying a powder comprising metal to the patterned adhesive layer; and
   (f) firing the patterned substrate at a temperature and time sufficient to remove the adhesive layer and sinter the powder.

2. The process of claim 1, characterized in that the layer that is at least temporarily tacky is a light-sensitive layer, whose tackiness changes on exposure to light.

3. The process of claim 2, characterized in that the light-sensitive layer contains dihydropyridine compounds.

4. The process of claims 1 characterized in that the metal of the metal powder is selected from gold, silver, palladium, platinum and copper and alloys of two or more of these metals.

5. The process of claim 1 characterized in that the supplementary element(s) is selected from the group consisting of lead, rhodium, nickel, aluminum, cadmium, copper, indium, boron and bismuth.

6. The process of claim 1 characterized in that the salt solution contains water and/or other polar liquids as solvents.

7. The process of claim 1 characterized in that the salt(s) of the supplementary element(s) is/are selected from the group consisting of acetates, nitrates, borates and chlorides.

8. The process of claim 1 characterized in that the salts and the temperature of the thermal treatment after drying are selected so that a continuous, homogeneous, film is created on the substrate from the compounds of the supplementary elements.

* * * * *